United States Patent [19]

George

[11] Patent Number: 5,073,757
[45] Date of Patent: Dec. 17, 1991

[54] APPARATUS FOR AND METHOD OF MEASURING CAPACITANCE OF A CAPACITIVE ELEMENT

[75] Inventor: Richard E. George, Everett, Wash.

[73] Assignee: John Fluke Mfg. Co., Inc., Everett, Wash.

[21] Appl. No.: 248,489

[22] Filed: Sep. 23, 1988

[51] Int. Cl.⁵ .......................................... G01R 27/26
[52] U.S. Cl. .................................. 324/677; 324/605; 324/649; 324/658
[58] Field of Search ............. 324/60 CD, 60 R, 60 C, 324/677, 658, 686, 605, 649, 679

[56] References Cited

U.S. PATENT DOCUMENTS

| | | | |
|---|---|---|---|
| 3,824,459 | 7/1974 | Uchida | 324/60 CD |
| 3,947,760 | 3/1976 | Noguchi et al. | 324/60 CD X |
| 4,040,041 | 8/1977 | Fletcher et al. | 324/60 CD |
| 4,636,714 | 1/1987 | Allen | 324/60 CD |

Primary Examiner—Kenneth A. Wieder
Assistant Examiner—Robert W. Mueller
Attorney, Agent, or Firm—George T. Noe

[57] ABSTRACT

An apparatus for and a method of measuring capacitance employs a charge measuring system. While a capacitive element, which may be an unknown capacitor, is charged completely to a predetermined voltage, a charge proportional to the capacitance of the capacitive element is accumulated on the feedback capacitor of an integrating operational amplifier. Thereafter, the charge is measured by measuring the time required to completely remove the charge from the feedback capacitor using the same predetermined voltage as a reference. In a preferred embodiment, the present invention is manifested as a capacitance measurement feature in a hand-held multimeter wherein a largely conventional dual-slope analog-to-digital converter is employed as the charge measuring system.

7 Claims, 2 Drawing Sheets

APPARATUS FOR AND METHOD OF MEASURING CAPACITANCE OF A CAPACITIVE ELEMENT

BACKGROUND OF THE INVENTION

The present invention relates generally to measuring the impedance value of passive electronic components, and in particular to measuring capacitance using a charge measuring system.

Many of the well-known methods and circuits for measuring various properties of capacitors, including capacitance, leakage, parallel resistance, etc., are complex, difficult to perform or operate, subject to interpretation, and expensive. These include capacitance bridges, operational amplifiers, and other precision instrumentation. Often such equipment is found only in well-equipped repair and calibration shops.

It is well recognized that it would be desirable to include a capacitance measurement feature in an ordinary multimeter such as may be used in servicing electrical equipment. Such multimeters, generally designed to measure voltage, current, and D.C. resistance, are typically small, lightweight, and relatively inexpensive, and, accordingly, are very popular among service technicians in general. While rough capacitance estimates can often be made by observing the approximate charging time of an unkown capacitor through the resistance measuring circuit of a multimeter, most multimeter users would prefer a more accurate, but still minimal cost, method of measuring capacitance. However, the addition of known capacitance measuring systems, such as the complex signal conditioning systems mentioned above, add significant costs and bulk beyond those contemplated for basic multimeters. Also, for use in multimeters, the accidental misapplication of voltage to a capacitance measuring circuit must be anticipated. Series-connected impedances which prevent circuit damage may be impractical due to the difficulty of isolating true capacitance from the error-inducing effects of added impedances.

SUMMARY OF THE INVENTION

In accordance with the present invention, an apparatus for and method of measuring capacitance of a capacitive element employs a charge measuring system. A charging circuit comprising a reference resistor and a predetermined voltage source is connected in series with the capacitive element, which is allowed to charge completely. An integrating operational amplifier is coupled to the reference resistor in such a way that as long as the capacitive element is charging, a corresponding proportional charge is accumulated in a storage capacitor in the feedback path of the integrating operational amplifier. This first operational state is referred to as a charge cycle.

In a second operational state referred to as a measurement cycle, the integrating operational amplifier is uncoupled from the charging circuit and coupled to the predetermined voltage source in such a way that charge is removed from the storage capacitor. The storage capacitor is effectively connected across the inputs of a comparator that trips when the amount of charge on the storage capacitor reaches zero. The interval of time required for charge to be removed from the storage capacitor is directly proportional to the capacitance of the capacitive element, and such interval is measured using conventional techniques such as a gated digital counter that is enabled to count clock pulses at the start of the measurement cycle and inhibited by a transition developed at the output of the comparator when the trip point is reached. The time represented by the counter output may be read out in units of capacitance.

The integrating operational amplifier, comparator, and digital counter comprise a conventional analog-to-digital converter found in many handheld multimeters. Thus, a capacitance measurement feature may be added to such multimeters by modification in accordance with the principles of the present invention.

It is therefore one object of the present invention to provide a novel apparatus for and method of measuring capacitance.

It is another object of the present invention to provide a capacitance measuring apparatus employing a charge measuring system.

It is a further object of the present invention to provide a capacitance measuring feature in a hand-held multimeter without adding significant cost and bulk.

Other objects, features and advantages of the present invention will become obvious to those skilled in the art upon a reading of the following detailed description when taken in conjunction with the accompanying drawings.

DETAILED DESCRIPTION OF THE INVENTION

Figure 1:
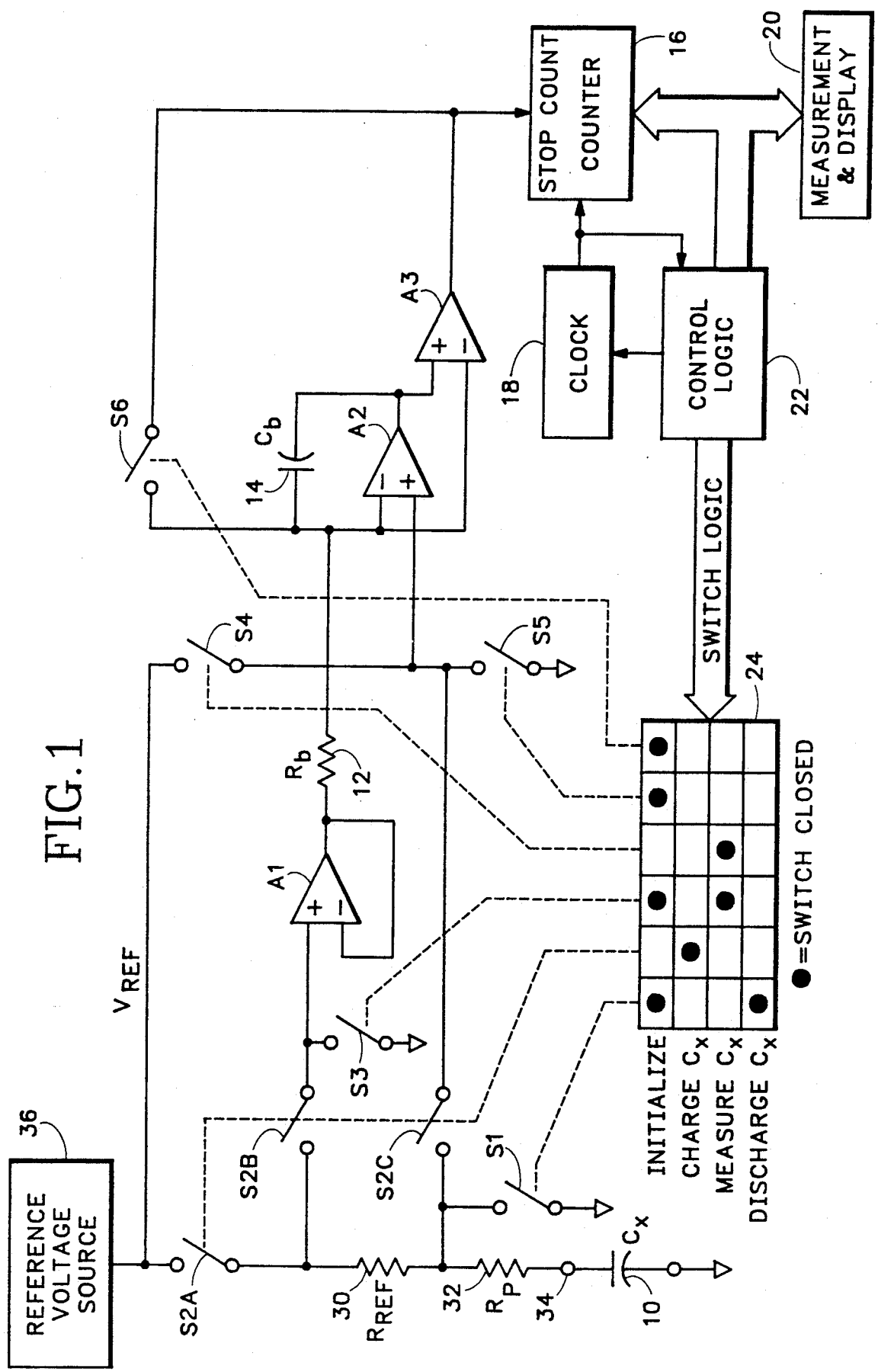
FIG. 1 is a detailed block diagram of a system for determining capacitance in accordance with the present invention.

Referring now to FIG. 1, there is shown a detailed block diagram of a system for measuring the capacitance $C_x$ of an unknown capacitor 10. The system makes use of a largely conventional dual-slope analog-to-digital converter (ADC) such as may be found in a multimeter; however, rather than being concerned with voltage levels, the system is adapted to measure electric charge Q wherein Q, measured in coulombs, is equal to the quantity of charge transferred by a unit of current in a unit of time, or $Q = i\,t$.

The dual-slope ADC comprises a buffer amplifier A1, connected as a unity-gain voltage follower, and its load resistor 12 having a value $R_b$ coupled to the inverting input of an integrating operational amplifier A2 having a storage capacitor 14 with a value $C_b$ connected from its output to its inverting input. Amplifiers A1 and A2, for purposes of this discussion, are assumed to exhibit negligible offset voltages and currents. The output of integrating operational amplifier A2 is coupled to one input of a comparator A3, whose other input is coupled to the inverting input of amplifier A2. It can be discerned from inspection of FIG. 1 that capacitor 14 is electrically connected across the two inputs of comparator A3. The output of comparator A3 is coupled to an inhibit or "stop count" input of a counter 16, which, when enabled during a measurement cycle, counts clock signals from a clock 18. The resultant count is transferred to a measurement and display unit 20. Overall operation of the system is controlled by a control logic unit 22, which may suitably include a microprocessor and timing circuits. The present invention can best be understood by reference to circuit operation.

Control logic circuit 22 sends switch logic signals to switch driving circuit 24, which is depicted graphically as a matrix with a column for each switch contact S1–S6 and connected thereto by a dashed line, and a row for each function. The switch driving circuit 24 and its associated switch contacts may be implemented in any of many ways well known to those skilled in the art. A black spot in the matrix indicates a switch closure, while no spot indicates that the switch is open.

The charging path for the unknown capacitance 10 includes the series connection of a reference resistor 30 having a value $R_{ref}$ and an overvoltage protection resistor 32 having a value $R_p$. Resistor 32 protects the input circuitry from damage to due to misapplication of a voltage to input terminal 34, and as will be seen soon, the resistance value $R_p$ does not affect the determination of the unknown capacitance $C_x$.

The first step in measuring an unknown capacitance is to initialize the system. When the control logic circuit 22 sends an "initialize" signal to switch driving circuit 24, switches S1, S3, S5, and S6 are closed. Closure of switch S1 grounds the junction of resistors 30 and 32, permitting the unknown capacitor 10 to be completely discharged. Closure of switch S3 grounds the input of buffer amplifier A1, which applies the ground reference (zero volts) through resistor 12 to the inverting input of operational amplifier A2. Closure of switch S5 grounds the non-inverting input of operational amplifier A2 and ensures complete discharge of capacitor 14. Closure of switch S6 sets the output of comparator A3 at zero volts.

Figure 2:
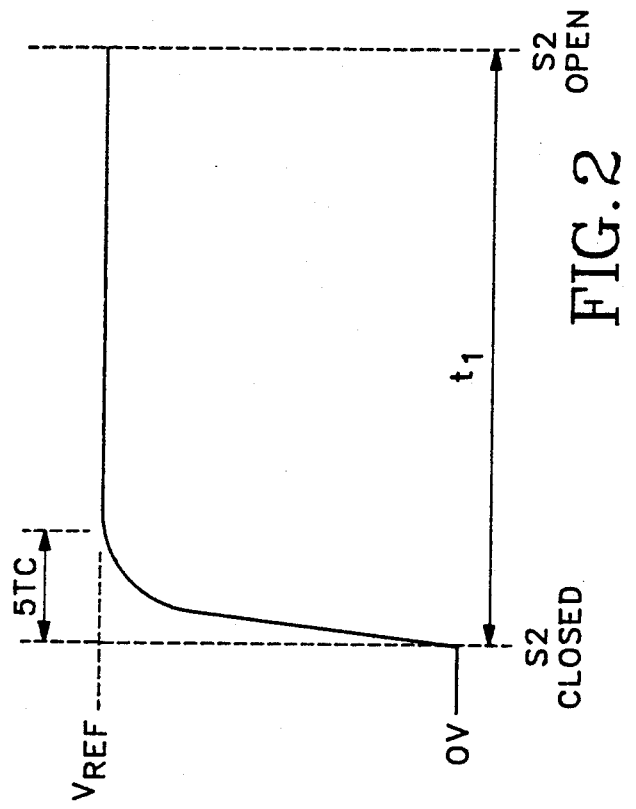
FIG. 2 is a waveform diagram showing the charging curve of an unknown capacitance for use in explaining operation of the system of FIG. 1.

Next, control logic circuit 22 sends a "charge $C_x$" signal to switch driving circuit 24, opening switches S1, S3, S5 and S6, and closing switches S2A, S2B and S2C for a fixed time interval $t_1$ to establish a charging cycle. During time interval $t_1$, a predetermined reference voltage source 36 is connected to the junction of reference resistor 30 and the input of buffer amplifier A1, and hence to one end of resistor 12. Unknown capacitor 10 begins to charge toward a fixed D.C. reference voltage $V_{REF}$ provided by the reference voltage source 36 through reference resistor 30 and overvoltage protection resistor 32. Capacitor 14 also begins to charge through resistor 12. The charging current through resistor 30 develops a proportional voltage thereacross which decreases as capacitor 10 charges, resulting in an increasing voltage (toward $V_{REF}$) applied to the non-inverting input of operational amplifier A2. That is, the two inputs of operational amplifier A2 are effectively coupled to opposite ends reference resistor 30 to sense the charging current therethrough, and through operational amplifier action, amplifier A2 and capacitor 14 integrate a corresponding proportional current flowing through resistor 12. Thus the integral of the capacitor 10 charging current over time interval $t_1$ accumulates to a proportional charge on storage capacitor 14. To ensure accurate charge accumulation on storage capacitor 14, several time constants must be allowed for charging capacitor 10 to its final voltage $V_{REF}$, or time interval $t_1 >> (R_{ref}+R_p)C_x$. For many practical purposes, a capacitor generally is considered charged within five time constants because it reaches about 99.3% of its final value. Once capacitor 10 reaches its full charge, there is no further current through resistor 30, and no further charge is accumulated on capacitor 14 because the two inputs of operational amplifier are balanced at $V_{REF}$ and there is no current through resistor 12. See FIG. 2 for the charging curve of capacitor 10. At the end of time interval $t_1$, as determined by a timing circuit in control logic circuit 22, switches S2A, S2b and S2C are opened.

Figure 3:
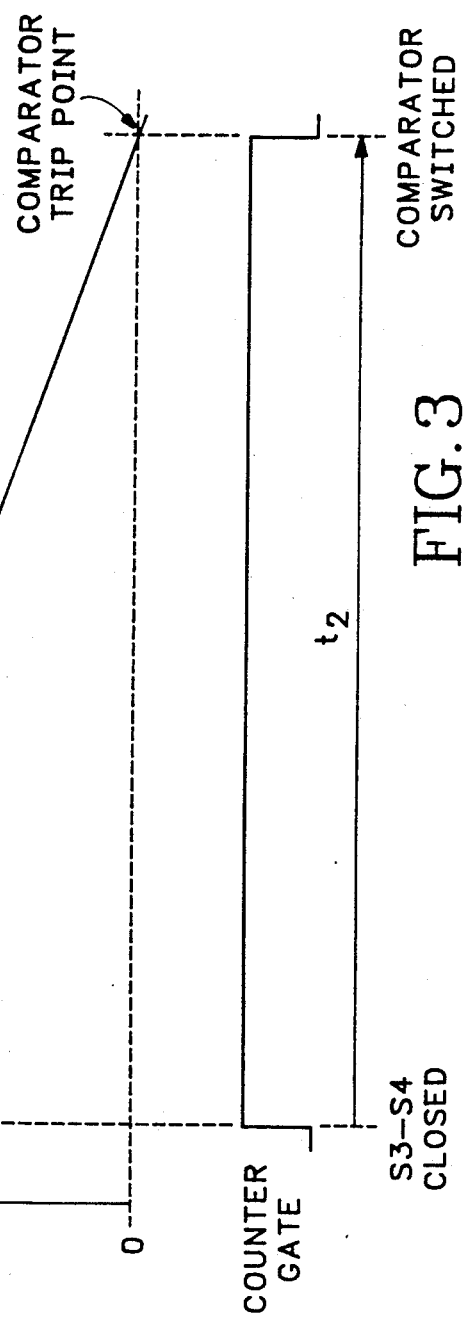
FIG. 3 is a waveform diagram showing the capacitance measurement aspects of the system of FIG. 1.

Control logic circuit 22 sends a "measure $C_x$" signal to switch driving circuit 24, closing switches S3 and S4 to establish a measurement cycle. Simultaneously, counter 16 is enabled and begins to count clock signals from clock 18 over a time interval $t_2$. Closure of switch S3 grounds the input of buffer amplifier A1, and hence one end of resistor 12. Closure of switch S4 applies reference voltage $V_{REF}$ to the non-inverting input of operational amplifier A2. The reference voltage $V_{REF}$ also appears, through operational amplifier action, at the inverting inputs of both amplifier A2 and comparator A3. Hence, reference voltage $V_{REF}$ is also applied across resistor 12, developing a constant current therethrough to discharge capacitor 14 at a linear rate. When the linearly rising voltage at the non-inverting input of comparator A3 matches $V_{REF}$ at its inverting input, indicating that the charge stored on capacitor 14 has dropped to zero, the output of comparator A3 switches states, stopping counter 16. The control logic circuit 22 then opens switches S3 and S4, and reads the contents of counter 16. See FIG. 3 for the capacitor 14 discharge waveform and elapsed time measurement.

The elapsed time $t_2$ measured between the closure of switches S3–S4 and the trip point of comparator A3 is proportional to each charge previously accumulated on respective capacitors 10 and 14. Since $V_{REF}$ is used both to charge capacitor 10 and discharge capacitor 14, the time $t_2$ is independent of $V_{REF}$. Equations which describe the charge and discharge operations are:

$$Q_{10} = V_{REF} C_x \tag{1}$$

$$Q_{14} = Q_{10}(R_{REF}/R_b) = (V_{REF}/R_b)t_2 \tag{2}$$

Combining equations (1) and (2) yields:

$$C_x = t_2/R_{REF} \tag{3}$$

Thus the capacitance $C_x$ of an unknown capacitor 10 may be quickly determined by measurement and display unit 20 and displayed along with appropriate capacitance units.

Capacitor 10 is discharged by closure of switch S1, as shown in FIG. 1, so that it may be safely removed from the input circuit. Actually, capacitor 10 may be discharged at any time after the charge to be measured has been accumulated on capacitor 14, and if continuous measurements are to be made, it would be desirable to discharge capacitor 10 during the measurement cycle so as to accelerate removal of charge therefrom prior to re-entering the "initialize" stage.

If a single measurement as described hereinabove does not provide necessary resolution, a series of two or more charge-discharge cycles of capacitor 10 can be carried out wherein capacitor 14 accumulates multiples of a single cycle. The measured multiple value is then simply divided by the number of charge-discharge cycles of capacitor 10 to provide a high-resolution value of $C_x$. Methods for accumulation, as well as methods for other applicable enhancements of the dual-slope measurement method, are well known to those skilled in the art.

It should be noted that for the most part, the diagram of FIG. 1 is also applicable to the resistance measuring function of a multimeter. Therefore, duplication or addition of circuit elements in order to implement both resistance and capacitance measurements in a practical multimeter design may be greatly minimized.

In a proposed commercial embodiment, the method and apparatus in accordance with the present invention is capable of measuring unknown capacitance values from one picofarad to five microfarads; however, capacitances outside this range may be easily measured by adjusting circuit parameters. Some typical values in the aforementioned proposed commercial embodiment are $V_{REF}=1.23$ volts, $R_{REF}=10$ megohms, one megohm, 100 kilohms, 10 kilohms, or one kilohm in selectable steps, $R_p=2$ kilohms, $R_b=16.6$ kilohms, and $C_b=0.022$ microfarads. Time interval $t_1$ may be selectable as well as $R_{REF}$, depending on the time required to allow several time constants; however, in this embodiment, $t_1$ has been chosen to be precisely 100 milliseconds. This time period is set by a timing circuit within logic circuit 22 in conjunction with clock 18. In that regard, clock 18 may be controlled by a stable and precise quartz oscillator of sufficient frequency for all attendant functions, for example, 40 kilohertz.

It will, therefore, be appreciated that the aforementioned and other desirable objects have been achieved; however, it should be noted that the particular embodiment of the invention which is shown and described is intended as merely illustrative and not as restrictive of the invention.

What I claim as my invention is:

1. Apparatus for measuring capacitance of a capacitive element, comprising:
   a charging circuit comprising a reference resistor connectable in series with said capacitive element, and a D.C. reference voltage source connectable across the series combination of said reference resistor and said capacitive element to charge said capacitive element to said reference voltage in a first operating state;
   charge accumulating means including a series combination of an input resistor and a storage capacitor coupled in said first operating state to said charging circuit for sensing charging current through said reference resistor and developing therefrom a corresponding proportional current through said input resistor to said storage capacitor to accumulate on said storage capacitor a charge proportional to the capacitance of said capacitive element; and
   measurement means coupled in a second operational state to said charge accumulating means for measuring said charge,
   wherein said charge accumulating means comprises an integrating operational amplifier which in said first operating state has a first input coupled through said input resistor to one end of said reference resistor and a second input coupled to an opposite end of said reference resistor to integrate a current proportional to current through said reference resistor.

2. Apparatus in accordance with claim 1 wherein said D.C. reference voltage is applied across said series combination of said reference resistor and said capacitive element for a predetermined time interval sufficiently long to allow said capacitive element to completely charge.

3. Apparatus for measuring capacitance of a capacitive element, comprising:
   a charging circuit comprising a reference resistor connectable in series with said capacitive element, and a D.C. reference voltage source connectable across the series combination of said reference resistor and said capacitive element to charge said capacitive element to said reference voltage in a first operating state;
   means including a series combination of an input resistor and a storage capacitor coupled in said first operating state to said charging circuit for sensing charging current through said reference resistor and developing therefrom a corresponding proportional current through said input resistor to said storage capacitor to accumulate on said storage capacitor a charge proportional to the capacitance of said capacitive element; and
   measurement means coupled in a second operational state to said charge accumulating means for measuring said charge, wherein said measurement means comprises means for removing charge from said storage capacitor at a controlled rate, and further wherein said charge removing means comprises an integrating operational amplifier which in said second operational state has a first input coupled through said input resistor to ground and a second input coupled to said reference voltage.

4. Apparatus in accordance with claim 3 wherein said measurement means further comprises means for measuring time required to remove said charge from said storage capacitor.

5. Apparatus in accordance with claim 4 wherein said time measuring means comprises a source of clock pulses and a counter for counting said clock pulses, said counter being enabled at the start of said second operational state and being disabled when the charge on said storage capacitor reaches zero.

6. Apparatus in accordance with claim 3 wherein said D.C. reference voltage is applied across said series combination of said reference resistor and said capacitive element for a predetermined time interval sufficiently long to allow said capacitive element to completely charge.

7. Apparatus for measuring the capacitance of a capacitive element, comprising:
   a reference resistor connected in series with said capacitive element;
   a predetermined D.C. voltage source connected across said reference resistor and said capacitive element during a first operational state;
   an integrating operational amplifier having a storage capacitor connected in a feedback path from the output of said operational amplifier to a first input thereof, said operational amplifier in said first operating state having said first input coupled through an input resistor to one end of said reference resistor and a second input coupled to the other end of said reference resistor, and said operational amplifier in a second operational state having said first input coupled through said input resistor to ground and said second input coupled to said predetermined D.C. voltage source;
   a comparator having a first input connected to one side of said storage capacitor and a second input connected to the other side of said storage capacitor;
   control means for controlling said first and second operational states of said operational amplifier; and
   measurement means coupled to said control means and to an output of said comparator for measuring time required to remove charge from storage capacitor.

* * * * *